United States Patent
Mih et al.

[11] Patent Number: 6,114,096
[45] Date of Patent: Sep. 5, 2000

[54] ASYMMETRICAL RESIST SIDEWALL

[75] Inventors: Rebecca Dora Mih, Wappingers Falls; Donald Coughlin Wheeler, Beacon, both of N.Y.; Timothy Allan Brunner, Ridgefield, Conn.

[73] Assignee: International Business Machines Corporation, Armonk, N.Y.

[21] Appl. No.: 09/175,856

[22] Filed: Oct. 20, 1998

Related U.S. Application Data

[62] Division of application No. 08/820,399, Mar. 12, 1997, Pat. No. 5,948,571.

[51] Int. Cl.[7] ..................................................... G03F 7/20
[52] U.S. Cl. ............................................. 430/311; 430/396
[58] Field of Search ..................................... 430/311, 322, 430/5, 396

[56] References Cited

U.S. PATENT DOCUMENTS

| | | | |
|---|---|---|---|
| 5,225,035 | 7/1993 | Rolfson | 156/643 |
| 5,300,379 | 4/1994 | Dao et al. | 430/5 |
| 5,300,786 | 4/1994 | Brunner | 250/548 |
| 5,302,477 | 4/1994 | Dao et al. | 430/5 |
| 5,308,722 | 5/1994 | Nistler | 430/5 |
| 5,328,784 | 7/1994 | Fukuda | 430/5 |
| 5,348,826 | 9/1994 | Dao et al. | 430/5 |
| 5,368,963 | 11/1994 | Hanyu et al. | 430/5 |
| 5,370,975 | 12/1994 | Nakatani | 430/325 |
| 5,487,962 | 1/1996 | Rolfson | 430/5 |
| 5,538,815 | 7/1996 | Oi et al. | 430/5 |
| 5,547,789 | 8/1996 | Nakatani et al. | 430/5 |
| 5,672,450 | 9/1997 | Rolfson | 430/5 |
| 5,718,829 | 2/1998 | Pierrat | 216/12 |

FOREIGN PATENT DOCUMENTS 5-61180  3/1993  Japan .

OTHER PUBLICATIONS

*New Focus Metrology Technique Special Test Mask*, Timothy A. Brunner, IBM Semiconductor Research and Development Center, Hopewell Junction, New York, 1994.

*Simulations and Experiments with the Phase Shift Focus Monitor*, T. A. Brunner & R. D. Mih, IBM Advanced Semiconductor Technology Center, Hopewell Junction, New York, 12533, Feb., 1996.

*Primary Examiner*—Kathleen Duda
*Attorney, Agent, or Firm*—DeLio & Peterson LLC; John J. Tomaszewski; Tiffany L. Townsend

[57] ABSTRACT

A photo mask and a method for using the photo mask to make asymmetric resist patterns are provided. A wafer having a resist coating thereon is exposed using the mask of the invention under specially controlled defocus conditions to provide the asymmetric resist pattern profile. The mask which comprises phase shifter means on one or both sides of a light shielding pattern forming material on the mask provides light passing through the mask having a different phase on each side of the light shielding material which produces an asymmetric resist pattern profile.

16 Claims, 3 Drawing Sheets

ASYMMETRICAL RESIST SIDEWALL

This is a divisional of application Ser. No. 08/820,399 filed on Mar. 12, 1997, now U.S. Pat. No. 5,948,571.

BACKGROUND OF THE INVENTION

1. Field of the Invention

This invention relates to a method for the manufacture of electronic components such as integrated circuit wafers using photoresists and an imaging system and, more particularly, to an exposure mask for use in a photoresist imaging system and to a method for using the mask to form asymmetric resist patterns.

2. Description of Related Art

In electronic component manufacture and in particular integrated circuit silicon wafer manufacturing, the key factor in delineating small patterns in the wafer is the shape of the resist pattern. The following description will be directed to integrated circuit silicon wafer manufacture but it will be appreciated by those skilled in the art that the invention may be applied to the manufacture of other electronic components such as gallium arsenide circuits, component packages and printed circuit boards.

In the manufacture of integrated circuit components such as semiconductors, electronic circuit pattern control, e.g., linewidth control, is becoming increasingly important because of even higher integration of the circuits and the linewidth and other circuit patterns are required to be increasingly fine and precise. Pattern control in photolithographic processes, however, is negatively impacted by numerous effects ranging from resist thickness variations, bake non-uniformities, non-flat wafers, etc.

Photolithography techniques are preferably used to form the fine resist pattern to define the circuit. In general, a resist is applied to a wafer at a predetermined thickness and the coated wafer is positioned on a wafer stage. Light from a light source passes through a photo mask having a predetermined mask (circuit) pattern thereon. The light passing through the photo mask is projected onto the resist on the wafer forming the mask pattern on the resist. The resists are typically negative resists or positive resists and the exposed resist is then processed using a number of cleaning, developing and etching steps to form a pattern on the wafer either in the form of openings in the resist which are to be metallized to form the desired circuit pattern (negative resist) or in the form of a positive resist pattern delineating the desired pattern on the wafer surface to be metallized. The above photolithographic process is shown in U.S. Pat. No. 5,300,786 which is assigned to the assignee of the present invention.

In either of the negative or positive resist methods or combination resist methods (e.g., image reversal resists), it is necessary that a photo mask be used to form the pattern on the resist and, traditionally, the imaging process using optical lithography creates a plurality of resist patterns which are each, in cross-section, of substantially constant width, height and symmetry. Under some exposure conditions, the width of the resist pattern may vary somewhat with the height of the resist with the width at the base being slightly wider than the width at the top of the resist. In any event, the resist pattern is still symmetrical and a metallized circuit line would be of essentially constant cross-section measured about a vertical axis extending upward from the midpoint of the base of the resist pattern.

There are many different integrated circuit manufacturing processes that require an asymmetric resist pattern as part of the process to provide desired circuit designs, and one application, for example, is to produce a pattern for lift off processes. These methods are well known in the art.

A number of attempts have been made to create an asymmetrical resist (photoresist) profile or pattern. In U.S. Pat. No. 5,547,789 to Nakatani et al. an asymmetrical light intensity profile is used to pattern a positive resist, which resist is then converted by flood illumination into a negative resist (image reversal resist) in order to affect the placement of subsequently formed gate electrodes. The purpose of the asymmetry of the resist pattern is to create an asymmetrical placement of the gate electrode. The asymmetrical intensity profile is achieved by a pattern transfer mask comprised of a transfer substrate, a linear light shielding film pattern disposed on the transparent substrate, and a means for reducing the intensity of light transmitted through a part of the mask on either side of the light shielding film pattern. The pattern transfer mask comprises a transparent substrate having different kinds of light attenuating films placed on the transparent substrate next to the light shielding pattern such as an opaque material, a light shielding film with different thicknesses or a semi-transparent film. The resist profiles shown are strongly re-entrant on both sides of the pattern which is not acceptable for many manufacturing methods.

Another patent which shows an asymmetrical light intensity profile is U.S. Pat. No. 5,370,975 to Nakatani wherein the mask designed to create the asymmetrical light profile employs a phase shifter with an edge angle ranging from 70°–85° or 95°–110° or the phase shifter is shaped to be smoothly curved. In U.S. Pat. No. 5,300,786, supra, there is a description of a phase shift mask which can shift the intensity profile of the light for the purpose of determining and controlling the focus settings of an optical lithography exposure system. When there is a change in focus, the minimum point of the intensity profile is shifted to create an asymmetrical displacement of the photoresist pattern to the left or right direction. The intensity profile is asymmetric about the minimum intensity peak point and it is the asymmetric peak shift which creates a pattern placement error which is used in conjunction with other reference patterns to measure the focus as an overlay by an automated overlay error measurement tool.

In U.S. Pat. No. 5,368,963 to Hanyu et al. a photo mask is shown comprising a light shielding layer formed on a mask substrate and light transmission areas defined on the mask substrate by the light shielding areas. The light transmitting areas are divided with phase shifters.

The above patents are hereby incorporated by reference.

Bearing in mind the problems and deficiencies of the prior art, it is therefore an object of the present invention to provide a photomask for use in an imaging system for making circuits on electronic components including integrated circuit wafers whereby photoresists used in the wafer manufacturing process can be imaged during the manufacturing process to form asymmetrical resist patterns. The base of the asymmetric resist pattern is typically wider or narrower then the top of the resist with the opposed walls joining the top and base of the resist having different angles with respect to the component substrate surface forming asymmetric resist. The resist pattern is generally asymmetric about a vertical axis extending from the midpoint of the base upward through the resist pattern.

It is a further object of the present invention to provide a method for making electronic components including integrated circuit wafers having asymmetrical resist patterns formed thereon during the manufacturing process. The resist pattern is typically wider or narrower at the base than the top with the walls joining the top and bottom of the resist having different angles with respect to the surface of the electronic component substrate forming asymmetric resist sidewalls. The resist pattern is generally asymmetric about a vertical axis extending from the midpoint of the base upward through the resist pattern.

Still other objects and advantages of the invention will in part be obvious and will in part be apparent from the specification.

SUMMARY OF THE INVENTION

The above and other objects, which will be apparent to those skilled in art, are achieved in the present invention which is directed in a first aspect to a photomask for use in an imaging system whereby light is passed through the mask and impinges on a photoresist covered substrate to form asymmetric resist patterns on the substrate such as an electronic component, e.g., an integrated circuit wafer, the mask comprising:

a mask substrate which allows light to pass therethrough having a light shielding material thereon in the form of lines and other shapes defining the desired resist pattern to be formed on the component substrate and wherein light phase shifting means is provided at least at one side of the light shielding means so that when light passes through the mask the phase of the light is different on each side of the light shielding means by other than 0° or 180°, or multiples thereof.

In a preferred aspect the mask comprises:

a mask substrate which allows light to pass therethrough;

a light shielding material on the mask substrate in the form of a plurality of lines and other shapes forming a pattern which defines the desired resist pattern to be formed on the photoresist coated on the mask substrate; and phase shifter means either in the form of a phase shifter material on the mask substrate or which means is a part of the substrate, which phase shifter means produces a phase shift of the light other than 0° or 180°, or multiples thereof, which phase shifter means is contiguous with one side of the light shielding material pattern and the mask substrate is on the other side of the light shielding material whereby light passing through the mask substrate has a different phase on each side of the light shielding material pattern and wherein, when the light passing through the mask is out of focus with the resist, the resist pattern is asymmetric about a vertical axis extending from the midpoint of the base upward through the resist.

In another aspect of the invention using the preferred mask of the invention, a method is provided for fabricating an electronic component such as an integrated circuit wafer which component had an asymmetric resist pattern formed on the component during the manufacturing process and wherein the electronic component substrate, e.g., wafer, is coated with a photoresist (e.g., negative, positive, or image reversal photoresist) and exposed to light traveling through a mask having the desired circuit pattern thereon, the method comprising:

coating the electronic component substrate, e.g., silicon wafer, with a photoresist material;

positioning the substrate on a holding, e.g., stepping, device;

positioning a mask so that light impinging on one surface of the mask travels through the mask and impinges on the coated substrate to form an image of the mask design in the photoresist material, the mask comprising:

a mask substrate which allows light to pass therethrough;

a light shielding material on the mask substrate in the form of lines and other shapes forming a pattern which defines the resist pattern to be formed in the resist on the coated substrate; and phase shifter means on the substrate either in the form of a phase shifter material or which means is a part of the substrate, which phase shifter means produces a phase shift of the light other than 0° or 180°, or multiples thereof, which phase shifter means is contiguous with one side of the light shielding material pattern and the mask substrate is on the other side of the light shielding material wherein light passing through the mask substrate has a different phase on each side of the light shielding material pattern and wherein when the light passing through the mask is out of focus with the resist, the resist pattern is asymmetric about a vertical axis extending from the midpoint of the base upward through the resist;

exposing the mask to light;

developing the exposed substrate to form the desired resist pattern on the substrate; and forming the desired electronic component.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

Figure 1:
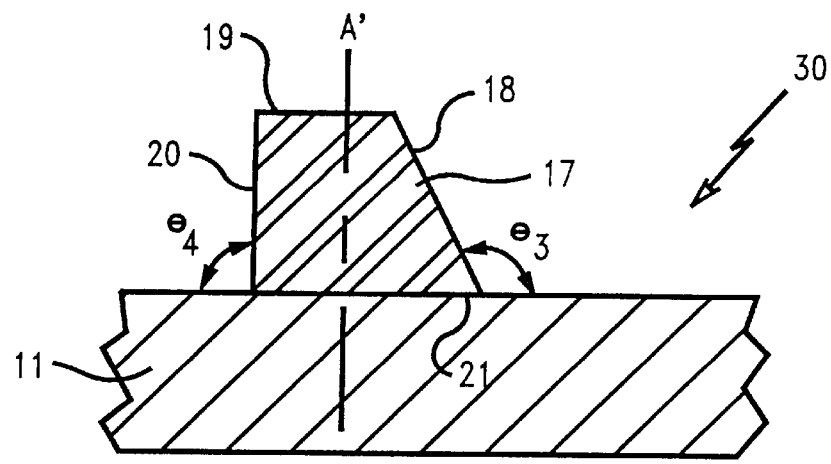
FIG. 1 shows a cross-sectional view of a substrate having an asymmetric resist formed thereon using a mask and method of the invention.

In describing the preferred embodiments of the present invention, reference will be made herein to FIGS. 1–5c of the drawings in which like numerals refer to like features of the invention. Features of the invention are not necessarily shown to scale in the drawings.

The masks of the present invention can be used in any optical lithography system which systems are well-known in the art. The systems may also be termed projection imagery systems and a typical system is described in U.S. Pat. No. 5,300,786, supra, where a photolithography mask structure having a novel optical focus test pattern is used to project test patterns on a resist coated semiconductor. Basically, these systems utilize an illumination source typically comprising a mirror, an arc lamp, a light filter and a condenser lens system. The illumination source outputs "light" to a mask structure which is pre-patterned as desired, e.g., to project a wiring level of an integrated circuit under fabrication. As used herein, the term "light" refers to light used in photolithography. The terms "light" and "photolithography" in the specification need not be restricted to visible light but can also embrace other forms of radiation and lithography. Light passing through the mask structure typically intersects a reduction lens which focuses the mask pattern into particular lens fields fabricated on the semiconductor wafer. The wafer is held in position by a vacuum hold device (or chuck), the position of which is controlled by an accurate X,Y,Z location controller or stepper motor.

Focus is typically quantified as an offset error in the location of the wafer in the Z dimension relative to a perfectly focused image plane. For purposes of the subject invention, the image plane can be at any point, e.g., typically either the top of the resist material or the base of the resist material or any point in between. The image plane may also be above the top of the resist or below the base of the resist.

The focus offset or defocus as discussed hereinbelow, has either a positive or a negative Z displacement with respect to the ideal focal image plane along with a magnitude representative of the distance by which the image plane is out of focus. The vacuum hold device will typically be adjusted to provide the desired defocus to perform the method of the present invention. Another projection exposure apparatus which is generally used for pattern formation using a mask is shown in FIG. 9 of U.S. Pat. No. 5,370,975, supra.

To determine the best defocus to use to make the desired asymmetric resist sidewall, it is preferred to use a defocus matrix test procedure as part of the electronic component manufacturing process. Thus, a wafer having multiple chips thereon is coated with the photoresist, each chip exposed using a different defocus condition, then baked and developed using typical procedures. Each chip cross-section is then viewed across the resist sidewall with a scanning electron microscope (SEM) to determine the best defocus condition. For example, if the wafer has ten (10) chips, the defocus for each chip could be made to vary in the following sequence: −1.0 μm, −0.8 μm, −0.6 μm, −0.4 μm, −0.2 μm, 0 μm, +0.2 μm, +0.4 μm, +0.6 μm, +0.8 μm. Other sequences could be used depending on the manufacturing process.

Figure 2:
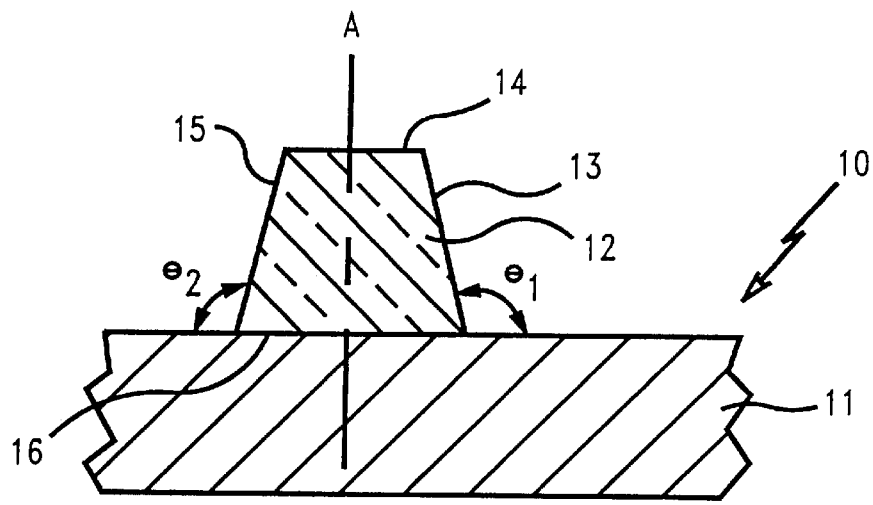
FIG. 2 shows a cross-sectional view of a substrate having a symmetric resist pattern formed thereon by the prior art.

Referring to FIG. 2, a substrate is shown containing a patterned resist generally as 10 and comprises a substrate 11 having the patterned resist 12 thereon. The patterned resist would be typically formed by exposing a substrate having a resist completely coated thereon with an exposure process and then developing the exposed resist to remove the unwanted resist and to form the pattern 12 shown in FIG. 2. The resist 12 is shown having sidewalls 13 and 15 and top 14 and base 16. A vertical axis A intersecting the midpoint of the base 16 divides the resist pattern in half showing a symmetrical resist pattern. Accordingly, angles θ1 and θ2 are essentially equal.

As is well-known in the art, light exposure conditions, the type resist, bake and develop and reflection from the wafer surface will affect the shape of the resist pattern 12 but, in any event, the resist will be substantially symmetric about vertical axis A. For example, angles θ1 and θ2 while substantially equal may vary slightly depending on the above parameters. In some cases, θ1 and θ2 will be 90° forming a resist 12 having a constant cross-section from the base of the resist to the top of the resist. In FIG. 2 the cross-section is shown reducing in size going from the base of the resist pattern to the top of the resist pattern.

Using the mask and method of the invention, a resist shown generally as 30 in FIG. 1 may be formed. Accordingly, a substrate 11 is completely coated with a photoresist (not shown), exposed and developed to form a resist pattern 17 having sidewalls 18 and 20, a base 21 and top 19. The formed resist pattern 17 has sidewall angles 83 and 84. The resist 17 is asymmetric about vertical axis A' which axis bisects the base 21 of resist 17. Accordingly, angle θ3 is different from θ4. Comparing FIGS. 1 and 2, it can be seen that the symmetric resist pattern 12 of the prior art (FIG. 2) is different from the asymmetric resist pattern 17 made using the mask and method of the invention.

Figure 3:
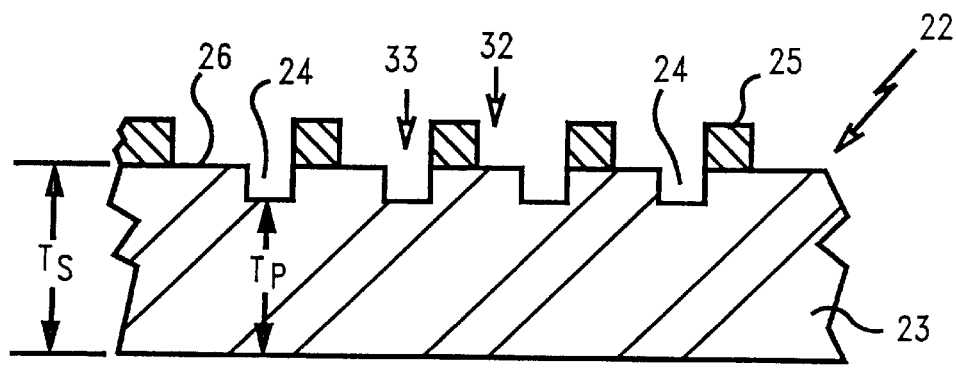
FIG. 3 shows a cross-sectional view of a mask of the invention used to form a plurality of parallel asymmetric resist patterns on a substrate.

Referring to FIG. 3, a mask of the invention is shown generally as 22. The mask 22 comprises a transparent substrate 23 having a thickness $T_s$. The substrate 23 has light shielding material 25 thereon in the form of parallel lines. Contiguous with each light shielding material 25 is a channel 24 which, in effect, reduces the thickness of substrate 23 as represented by $T_p$. The thickness of the substrate $T_s$ is therefore greater than the thickness of the substrate at channel 24 ($T_p$) and light transmitted through mask 22 has a different phase on each side 32 and 33 of light shielding material 25. The mask may be generally described as having light shielding areas 25 between areas providing a difference in phase for the light passing through the mask. More specifically, for a line mask as shown in FIG. 3, the mask comprises from left to right, a repeating pattern of phase shift means 24, light shielding means 25 and substrate 23 having a surface 26. As is well-known to those skilled in art, other methods may be used to change the phase of the light transmitted through the mask 22 such as the use of a phase shifter material such as Spin On Glass in place of the channel 24.

Figure 4A:
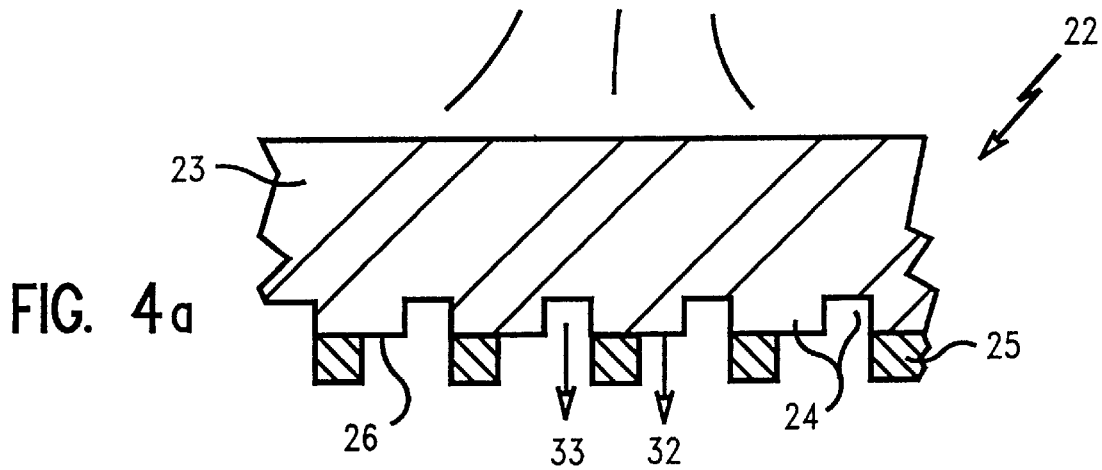
FIG. 4a shows a cross-section of a mask of the invention and FIGS. 4b and 4c show cross-sectional views of a resist pattern having asymmetric sidewalls made with a positive resist on a substrate using the mask and method of the invention.
Figure 4B:
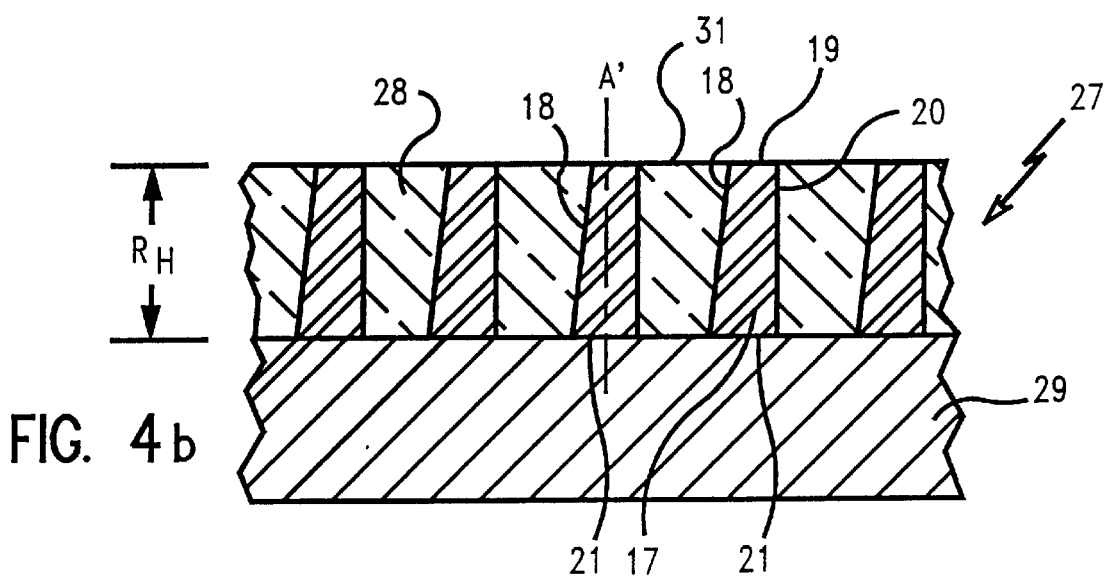
Figure 4C:
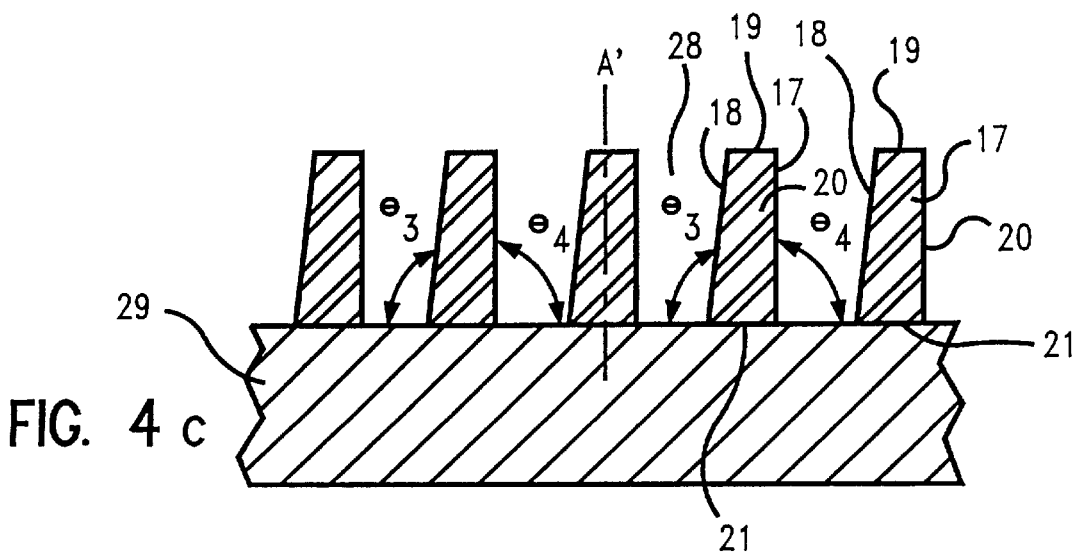

Referring to FIGS. 4a, 4b and 4c a method is shown for using the masks of the invention to form a substrate having an asymmetric resist pattern formed thereon. In FIG. 4a light is shown impinging on mask 22 of the invention which comprises a transparent substrate 23 having a surface 26 having light shielding lines 25 thereon with contiguous channel areas 24 on one side of the light shielding material in a repeating pattern to form a phase shift of the light so that the phase of the light traveling through mask 22 is different on each side 32 and 33 of light shielding material 25.

FIG. 4b shows an electronic component generally as 27 comprising a substrate 29 coated with a positive photoresist material 31 having a thickness $R_H$. Resist patterns 17 are formed having sidewalls 18 and 20 and base 21 and top 19. Exposed resist is shown as 28 and when developed is soluble and would be removed forming the resist pattern substrate shown in FIG. 4c. As can be seen from FIG. 4c, angle θ3 is different from angle θ4 forming an asymmetric resist pattern 17 having asymmetric sidewalls 18 and 20. A vertical line A' bisecting base 21 of resist pattern 17 shows an asymmetric cross-section of the resist over the height of the resist. The resist is skewed on the side of the light shielding material having the phase shift means. The intensity profile of the light through the mask of the invention at the top of the resist in FIG. 4b is slightly asymmetric about midpoint A'. The asymmetry of the light intensity profile about midpoint A' is more pronounced at the base of the resist due to the finite thickness of the resist. A prior art mask (non-phase shift mask) would have a symmetric intensity profile which may be substantially the same at the top of the resist and at the base of the resist.

Referring again to FIG. 3, a typical mask 22 of the invention is shown. The transparent material 23 may be any suitable transparent material such as glass, calcium fluoride and fused silica and is typically fused silica. The thickness of the substrate $T_s$ will generally be about 90 mils to 300 mils. It is preferred to form the phase shift of the light passing through the mask by employing channels 24 in the substrate 23 which effects a phase shift of the light by its travel through a different substrate thickness ($T_s$ versus $T_p$). The necessary thickness for a desired phase shift can be easily determined. The difference between the phases of the light passing through the mask substrate at 32 and the opposed side 33 of light shielding material 25 must be other than 0° or 180°, or multiples thereof. In a highly preferred embodiment, it is preferred that the difference in phase of the light be 90°. Thus, the light passing through point 32 is the transmitted light from the exposure apparatus and the light passing through point 33 is phase shifted 90° or any other desired angle other than 0° or 180°, or multiples thereof.

The light shielding material 25 may be any suitable material such as molybdenum silicide and chrome and is typically chrome which is applied using conventional means such as sputtering or metal evaporation, preferably sputtering. The thickness of the light shielding material may vary widely and is generally about 50 nm to 150 nm. The purpose of the light shielding material 25 is to prevent light from passing through the mask where the material 25 is present onto the resist coated substrate being imaged.

Referring again to FIG. 4b, the substrate 29 is typically silicon or other semiconductor material and the resist material may be any photoresist such as a negative resist or a positive resist. While any resist may be used, it is preferred that the resolution of the resist be a medium or high resolution resist as is well-known in the art.

It is an important feature of the invention that the resist, thickness of the resist, the difference in phase of the light on each side of the light shielding material, the focus and light exposure dose during exposure be specially controlled either singly or preferably in combination to provide the desired asymmetric resist patterns of the invention. Each of the above parameters may be varied independently but are all preferably controlled within certain ranges to provide enhanced resist patterning results.

Any resist thickness (as shown as $R_H$ in FIG. 4b) may be employed, but it is preferred that greater thicknesses be used to provide a greater asymmetric resist pattern effect. The resist thickness will generally be about 0.1 $\mu$m to 10 $\mu$m and is preferably about 0.4 $\mu$m to 2 $\mu$m The defocus may also vary widely and is generally greater than the thickness of the resist, generally up to about ±10 $\mu$m and preferably about ±1 $\mu$m. Also preferred is a positive defocus rather than a negative defocus. The exposure dose is important and is generally chosen to be such that the width of the printed line is substantially equal to the width of the corresponding mask pattern. For example, for a 5 × stepper, a 2.0 $\mu$m mask feature will print a 0.4 $\mu$m width line. This is conventionally called "dose to size" and preferably, a dose of about 0.7 to 1.5 times the dose to size is preferred.

In a preffered embodiment, the illumination condition of the projection exposure tool would provide a coherency of about 0.25 to 0.8 preferably 0.6 or less.

Referring to FIG. 4a showing a mask and FIGS. 4b and 4c showing the exposed resist, a resist pattern was formed using a 365 nm (i-line) light with a 90° phase shift on one side of a 240 nm structure wafer dimensions in a positive tone resist of 0.85 $\mu$m thickness. A defocus of about –0.2 $\mu$m resulted in a substantially 90° profile on one side of the resist θ4 and a 95° profile on the other wall of the resist pattern θ3.

Figure 5A:
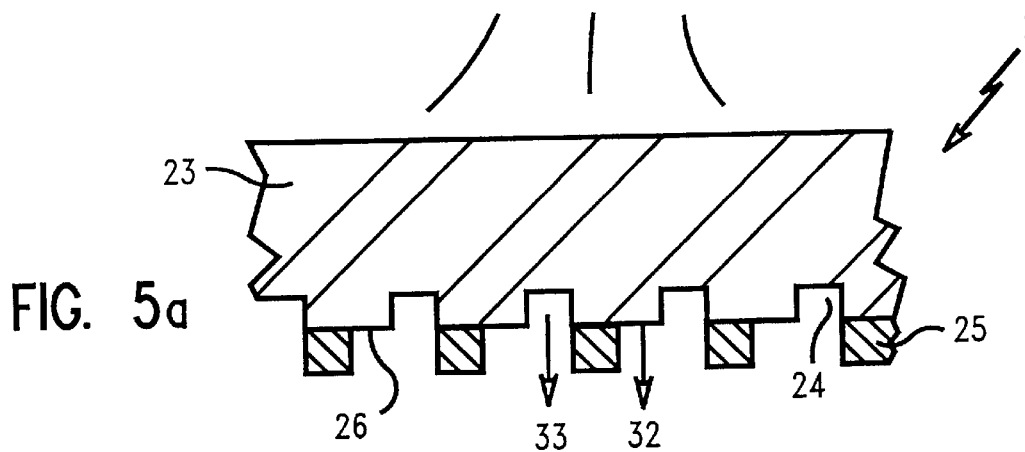
FIG. 5a shows a cross-section of a mask of the invention and FIGS. 5b and 5c show cross-sectional views of a resist pattern having asymmetric sidewalls made with a negative resist on a substrate using the mask and method of the invention.
Figure 5B:
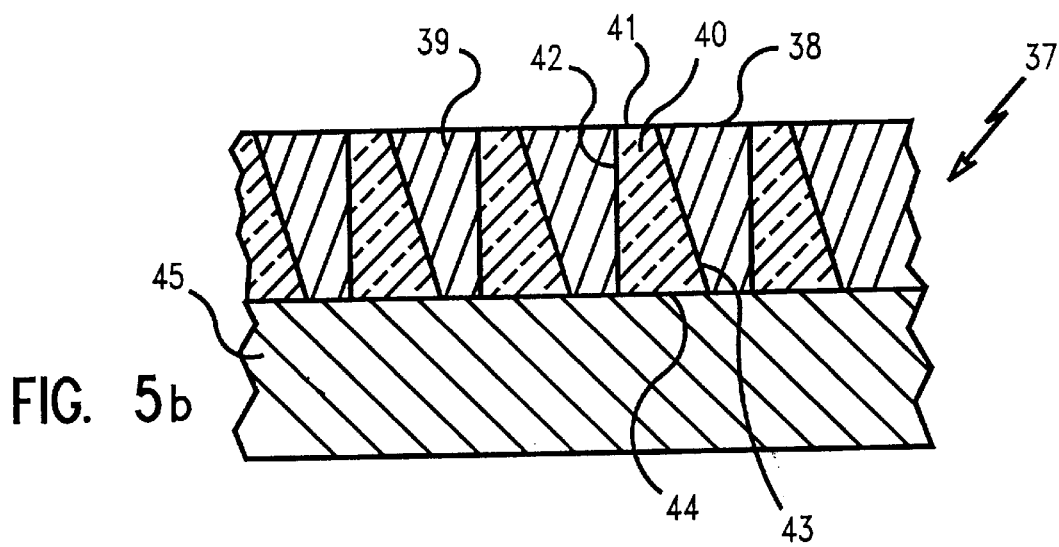
Figure 5C:
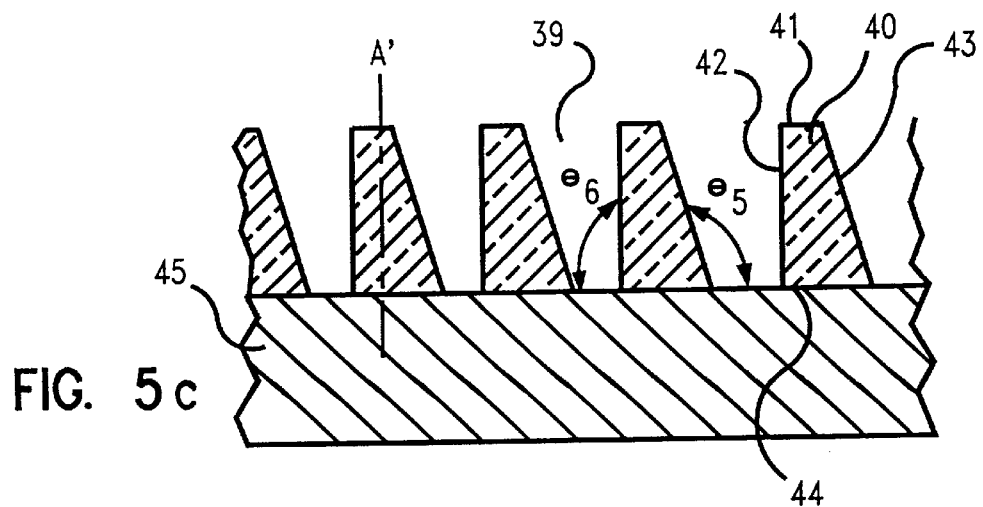

Referring to FIGS. 5a, 5b and 5c, the use of a mask and method of the invention is used to pattern a substrate coated with a negative resist. In FIG. 5a, mask 22a comprises a transparent substrate 23, light shielding members 25 and phase shifter channels 24. The surface of the substrate is shown as 26. Light passing through the mask is shown passing through the substrate without any phase shift as 32 and passing through channel 24 and being phase shifted as 33.

In FIG. 5b, a substrate 45 coated with a negative resist 38 shown generally as 37 is exposed to light and position 40 is made insoluble and the part not exposed to light 39, remains soluble. Exposed resist 40 has sidewalls 42 and 43, a base 44 and top 41. After developing as shown in FIG. 5c, soluble resist 39 is removed leaving negative resist 40. Angle θ5 is different from angle θ6 forming an asymmetric resist pattern 40 as shown by vertical axis A'. As discussed above for FIGS. 4a, 4b and 4c, the phase shift mask of the invention produces an asymmetric light intensity profile on the resist and an asymmetric resist pattern. Non-phase shift masks would produce a symmetric light intensity profile and a symmetric resist pattern.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

Thus, having described the invention, what is claimed is:

1. A method for fabricating an electronic component which component had an asymmetric resist pattern formed on the component during the manufacturing process and wherein the electronic component substrate is coated with a photoresist and exposed to light traveling through a mask having the desired circuit pattern thereon, the method comprising:

coating the electronic component substrate with a photoresist material;

positioning the substrate on a holding device;

positioning a mask so that light impinging on one surface of the mask travels through the mask and impinges on the coated substrate to form an image of the mask design in the photoresist material, the mask comprising:

a mask substrate which allows light to pass therethrough;

a light shielding material on the mask substrate in the form of lines and other shapes forming a pattern which defines the resist pattern to be formed in the resist on the coated substrate; and phase shifter means on the mask substrate continuously on at least at one side of the light shielding means so that when light passes through the mask the phase of light on the photoresist is different on each side of the light shielding means by other than 0° or 180°, or multiples thereof;

exposing the mask to light;

developing the exposed substrate to form the desired resist forming the desired electronic component.

2. The method of claim 1 wherein the light passing through the mask is out of focus with the photoresist.

3. The method of claim 2 wherein the amount of out of focus is greater than the thickness of the photoresist.

4. The method of claim 3 wherein the amount of out of focus is positive.

5. The method of claim 4 wherein the amount of out of focus is negative.

6. The method of claim 1 wherein the exposure dose of the light is such that the width of the resist pattern is substantially equal to the width of the corresponding mask pattern.

7. The method of claim 1 wherein the light has a coherency of about 0.25 to 0.8.

8. The method of claim 1 wherein the phase shifter means have vertical sidewalls.

9. A method for fabricating an electronic component which had an asymmetric resist pattern formed on the component during the manufacturing process and wherein the electronic component substrate is coated with a photoresist and exposed to light traveling through a mask having the desired circuit pattern thereon, the method comprising:

coating the electronic component substrate with a photoresist material;

positioning the substrate on a holding device;

positioning a mask so that light impinging on one surface of the mask travels through the mask and impinges on the coated substrate to form an image of the mask design in the photoresist material, the mask comprising:

a mask substrate which allows light to pass therethrough;

a light shielding material on the mask substrate in the form of parallel lines which defines the resist pattern to be formed in the resist on the coated substrate; and phase shifter means on the mask substrate continuously at the same side of each of the parallel lines defined by the light shielding means so that when light passes through the mask the phase of light on the photoresist is different on each side of the light shielding means by other than 0° or 180°, or multiples thereof;

exposing the mask to light;

developing the exposed substrate to form the desired resist pattern on the substrate; and forming the desired electronic component.

10. The method of claim 9 wherein the light passing through the mask is out of focus with the photoresist.

11. The method of claim 10 wherein the amount of out of focus is greater than the thickness of the photoresist.

12. The method of claim 11 wherein the amount of out of focus is positive.

13. The method of claim 11 wherein the amount of out of focus is negative.

14. The method of claim 9 wherein the exposure dose of the light is such that the width of the resist pattern is substantially equal to the width of the corresponding mask pattern.

15. The method of claim 9 wherein the light has a coherency of about 0.25 to 0.8.

16. The method of claim 9 wherein the phase shifter means have vertical sidewalls.

* * * * *